United States Patent
Aziz et al.

(10) Patent No.: US 8,194,792 B2
(45) Date of Patent: Jun. 5, 2012

(54) LOOK-AHEAD DIGITAL LOOP FILTER FOR CLOCK AND DATA RECOVERY

(75) Inventors: Pervez Mirza Aziz, Dallas, TX (US); Necip Sayiner, Orefield, PA (US)

(73) Assignee: Agere Systems Inc., Allentown, PA (US)

( * ) Notice: Subject to any disclaimer, the term of this patent is extended or adjusted under 35 U.S.C. 154(b) by 841 days.

(21) Appl. No.: 11/029,977

(22) Filed: Jan. 5, 2005

(65) Prior Publication Data

US 2006/0146959 A1  Jul. 6, 2006

(51) Int. Cl.
 *H03D 3/24* (2006.01)
(52) U.S. Cl. .................................. 375/327; 375/373
(58) Field of Classification Search .................. 375/373, 375/376, 327; 331/17; 327/156, 147
See application file for complete search history.

(56) References Cited

U.S. PATENT DOCUMENTS

| | | | |
|---|---|---|---|
| 6,236,343 B1 * | 5/2001 | Patapoutian | 341/111 |
| 6,580,376 B2 * | 6/2003 | Perrott | 341/61 |
| 6,765,445 B2 * | 7/2004 | Perrott et al. | 331/17 |
| 6,998,923 B2 * | 2/2006 | Melanson | 331/17 |
| 7,127,017 B1 * | 10/2006 | Evans et al. | 375/355 |
| 7,277,518 B2 * | 10/2007 | Loke et al. | 375/373 |
| 7,633,322 B1 * | 12/2009 | Zhuang et al. | 327/156 |
| 7,634,040 B1 * | 12/2009 | Yang et al. | 375/376 |
| 2001/0005164 A1 * | 6/2001 | Okamoto | 331/17 |
| 2003/0128074 A1 * | 7/2003 | Maxim et al. | 331/17 |
| 2003/0198105 A1 * | 10/2003 | Yamaguchi et al. | 365/200 |
| 2003/0234693 A1 * | 12/2003 | Staszewski et al. | 331/16 |
| 2003/0235262 A1 * | 12/2003 | Staszewski et al. | 375/376 |
| 2005/0094751 A1 * | 5/2005 | Serizawa | 375/346 |
| 2007/0001772 A1 * | 1/2007 | Da Dalt | 331/78 |
| 2007/0018746 A1 * | 1/2007 | Wang et al. | 331/182 |

* cited by examiner

*Primary Examiner* — Aristocratis Fotakia

(57) ABSTRACT

The present invention enhances the performance of a clock and data recovery (CDR) circuit by employing look-ahead techniques to produce a low latency timing adjustment. In one example of the invention employed in a CDR circuit having a decimation filter processing the CDR's phase detector output, the invention uses the most significant bits of the decimation filter output to quickly determine a look-ahead adjustment.

18 Claims, 8 Drawing Sheets

LOOK-AHEAD DIGITAL LOOP FILTER FOR CLOCK AND DATA RECOVERY

FIELD OF THE INVENTION

The present invention relates to clock recovery and data extraction and, more particularly, to clock recovery and data extraction using digital circuitry.

BACKGROUND OF THE INVENTION

Clock and data recovery (CDR) operations are performed in many communications circuits. Digital communication receivers must sample an analog waveform and then detect the sampled data reliably. The phase of the analog waveform is typically unknown and there may be a frequency offset between the frequency at which the original data was transmitted and the nominal receiver sampling clock frequency. The CDR function is to properly sample an analog waveform such that when the sampled waveform is passed through a data detector, the data is recovered properly despite the fact that the phase and frequency of the transmitted signal are not known. CDR architectures implemented on an integrated circuit chip should not only perform the CDR function robustly but should also be area and power efficient.

As illustrated in FIG. 1, a typical serializer/deserializer (SERDES) communication "macrocell" consists of multiple channels (Channel 0, Channel 1, . . . , Channel P), each performing its own CDR function. A common reference clock circuit 102 provides a clock (REFCLK) 104 which is used in each channel to sample the analog waveform 106. The CDR feedback loop must adjust the phase and frequency of the nominal clock to produce a modified clock, a recovered clock 110, which can sample the analog waveform to allow proper data detection 112. A typical data detector 108 might be a simple slicer (decision device based on an amplitude threshold) or a more complicated detector such as a sequence detector. Since the CDR architecture hardware is replicated multiple times, area and power efficiency of the CDR hardware is an important consideration.

Various methods exists in the prior art for performing this CDR function. FIG. 2 illustrates one well known CDR architecture which makes use of an analog loop filter and a voltage controlled oscillator (VCO) to provide the recovered clock. Integral to the depicted analog loop filter 204 is an analog charge pump (not illustrated) which processes the output of phase detector 202 for use by the analog loop filter 204. Another approach is shown in FIG. 3 where digital loop filter 302 controls a phase selection circuit (PSC) 304 which continually adjusts the phase of the reference clock to effectively modify its phase and/or frequency to produce the recovered clock 110. The digital loop filter 302 may consist of one or more sub-filters. One significant drawback to this approach is that the loop filter and PSC must operate at the full high speed data rate. Further, the fixed point arithmetic performed by the digital loop filter must be done with relatively high resolution (more than 9 bits, in some applications 18 bits) and so involves complex fixed point signed arithmetic. Since the complex fixed point arithmetic operates at the full data rate, this results in a relatively large area and power for the digital loop filter and resulting CDR.

More recent CDR architecture has employed a digital loop filter in combination with a VCO, in which the input to the digital loop filter is decimated. The process of decimation involves discarding samples so that data can be processed at a lower rate of speed in the digital loop filter where, as noted above, complex high resolution fixed point signed arithmetic operations take place. Typically, before discarding samples, they are processed by the decimation filter to minimize the information loss from the phase detector. As used herein, the process of discarding samples is called downsampling and the overall process of decimation filtering and downsampling is called decimation. A high level block diagram of an example of a decimated loop filter is shown in FIG. 4 where downsampling 404 by a factor of D occurs after the decimation filter 402. Consequently, only one out of every D high speed samples is retained and processed by the digital loop filter 302.

Although beneficial, the above decimated loop architecture has limitations. The performance of such a system suffers significantly when the decimation factor becomes larger or when there are excessive delays or latency in the loop components such as the phase detector, PSC or decimation filter calculations.

The present invention overcomes these shortcomings and enhances the performance of prior CDR architectures by adopting a look-ahead digital loop filter architecture.

SUMMARY OF THE INVENTION

The present invention enhances the performance of a digital CDR loop by employing look-ahead techniques to produce a lower latency timing adjustment. In one embodiment of the invention applicable to decimated digital CDR loop filters, the invention thresholds the output of the decimation filter before it is processed by the entire loop filter. This threshold result is then processed quickly with low latency to determine the look-ahead adjustment. In additional embodiments, the decimation filter output, or a compensated version of it, is then processed through the normal higher latency path of the rest of the loop filter to produce a non look-ahead adjustment to a PSC. The look-ahead path and the non-look-ahead path adjustments are then combined to produce an overall adjustment to the PSC.

These and other features of the invention will be more fully understood by references to the following drawings.

DETAILED DESCRIPTION

Figure 1:
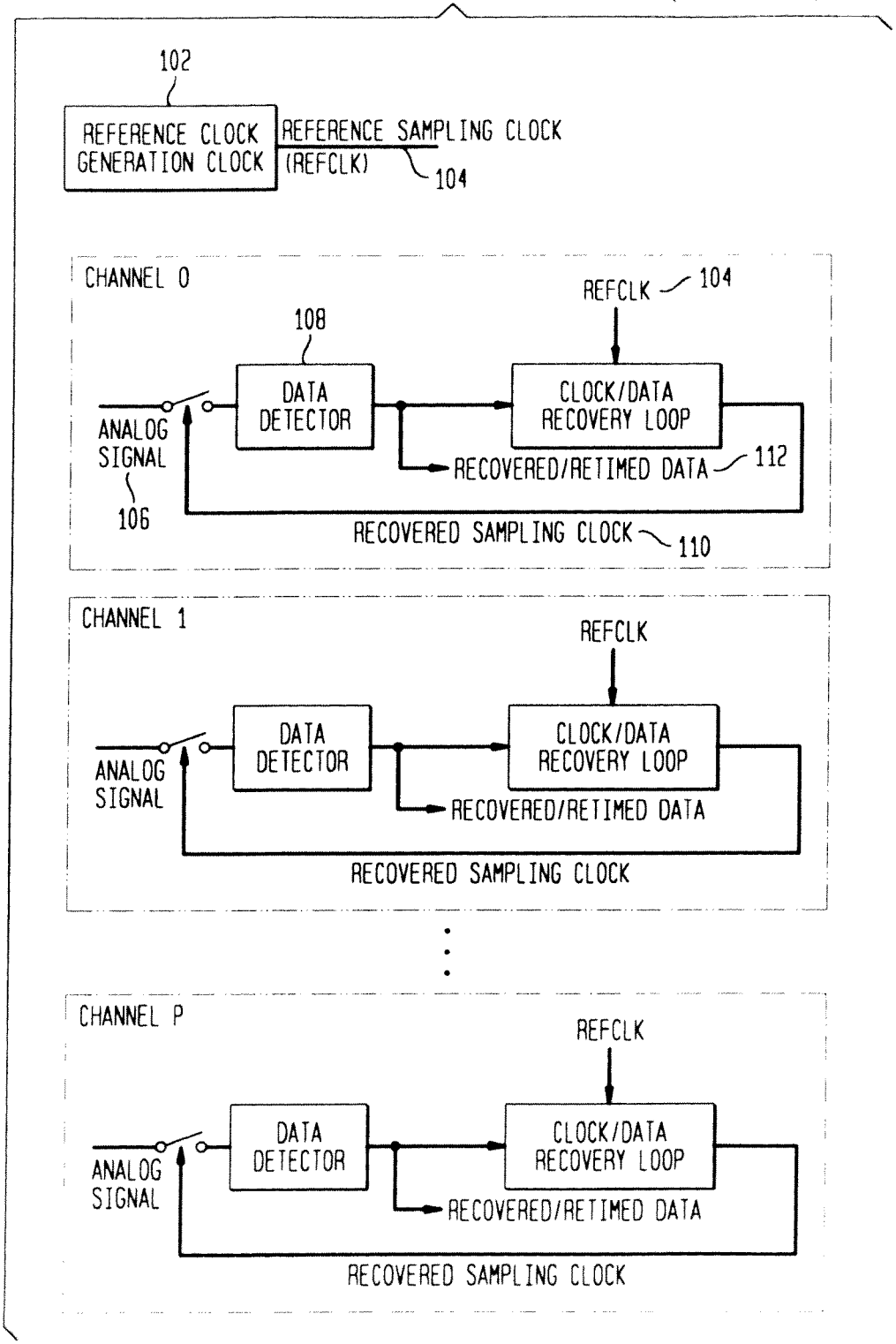
FIG. 1 is a block diagram of a SERDES macro cell containing multiple SERDES channels driven by a common reference clock.
Figure 2:
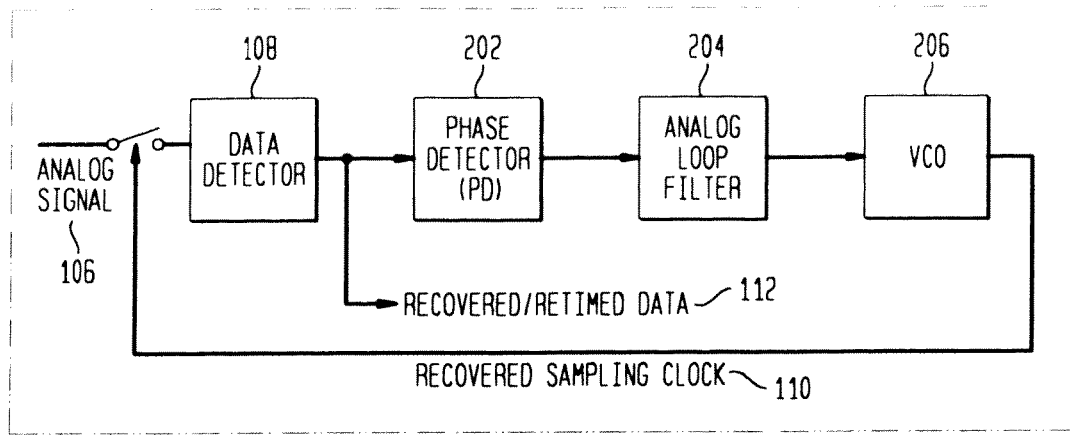
FIG. 2 is a prior art example of analog loop filter based CDR architecture.
Figure 3:
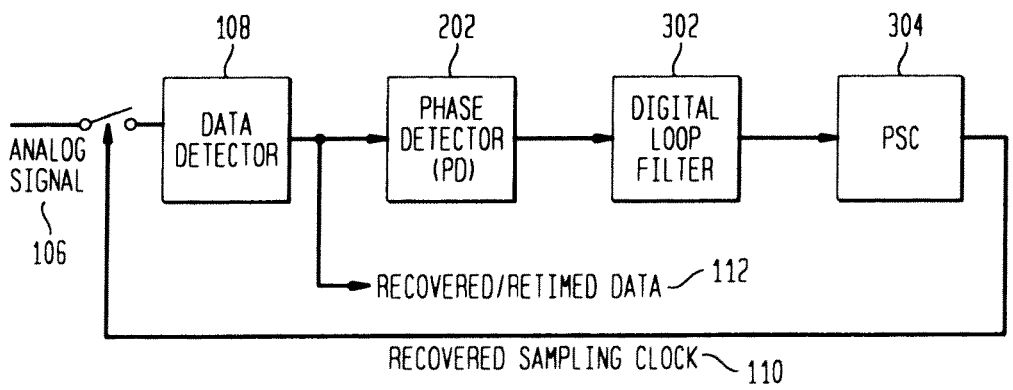
FIG. 3 is a prior art example of digital loop filter based CDR architecture.
Figure 4:
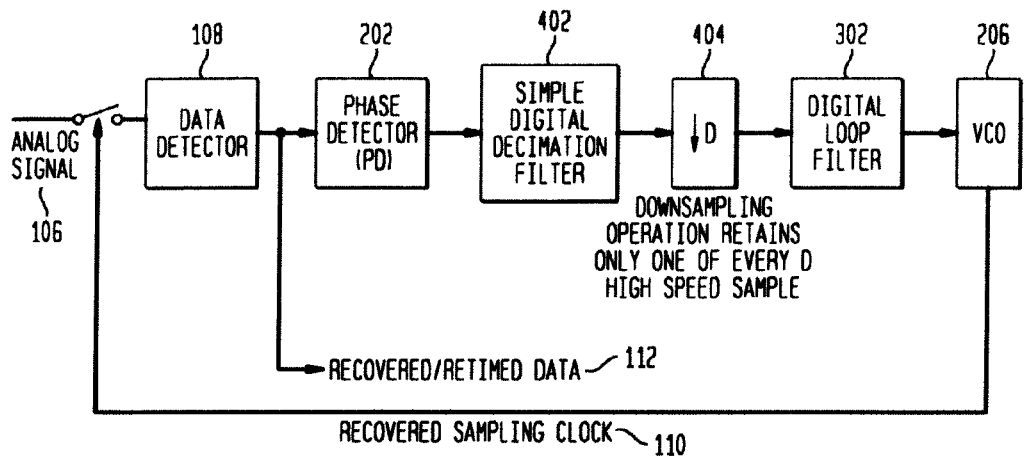
FIG. 4 illustrates a prior art decimated digital loop filter based CDR architecture employing a VCO.
Figure 5:
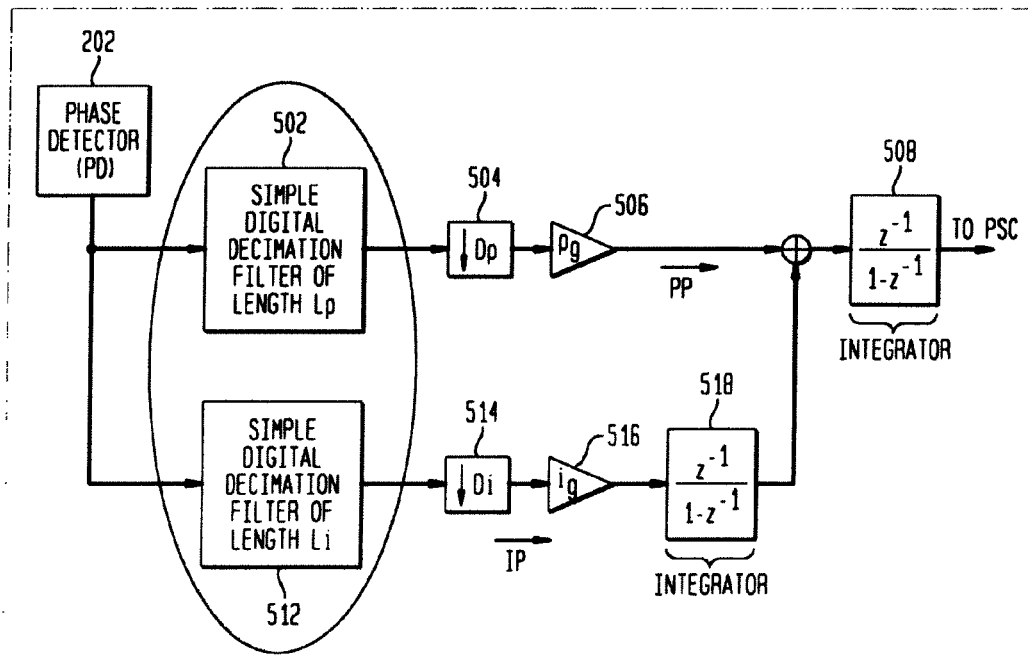
FIG. 5 is a Z-domain representation of a decimated digital filter having a second order loop filter consisting of two sub-filters.

An embodiment of the invention will now be described with reference to an exemplary CDR arrangement having a second order loop filter consisting of two sub-filters, this filter arrangement having a proportional path filter and an integral path filter. FIG. 5 illustrates a Z-domain representation of such a digital loop filter which is preceded by decimation filtering. The building blocks of the sub-filters are integrator blocks 508 and 518 which in the Z-domain have transfer functions:

$$\frac{z^{-1}}{1-z^{-1}}$$

As illustrated in FIG. 5, there is a "proportional" path pp sub-filter, through which the output of the phase detector 202 is filtered by a decimation filter 502 of length $L_p$, decimated at 504 by a factor of $D_p$, gained at 506 by a gain of $p_g$ and passed through an integrator 508. Also illustrated is an "integral" path ip sub-filter, through which the output of the phase detector 202 is similarly decimated by a decimation filter 512 of length $L_i$, downsampled at 514 by a factor of $D_i$, gained at 516 by a gain of $i_g$ and passed through two successive integrator stages, 518 and 508.

Figure 6:
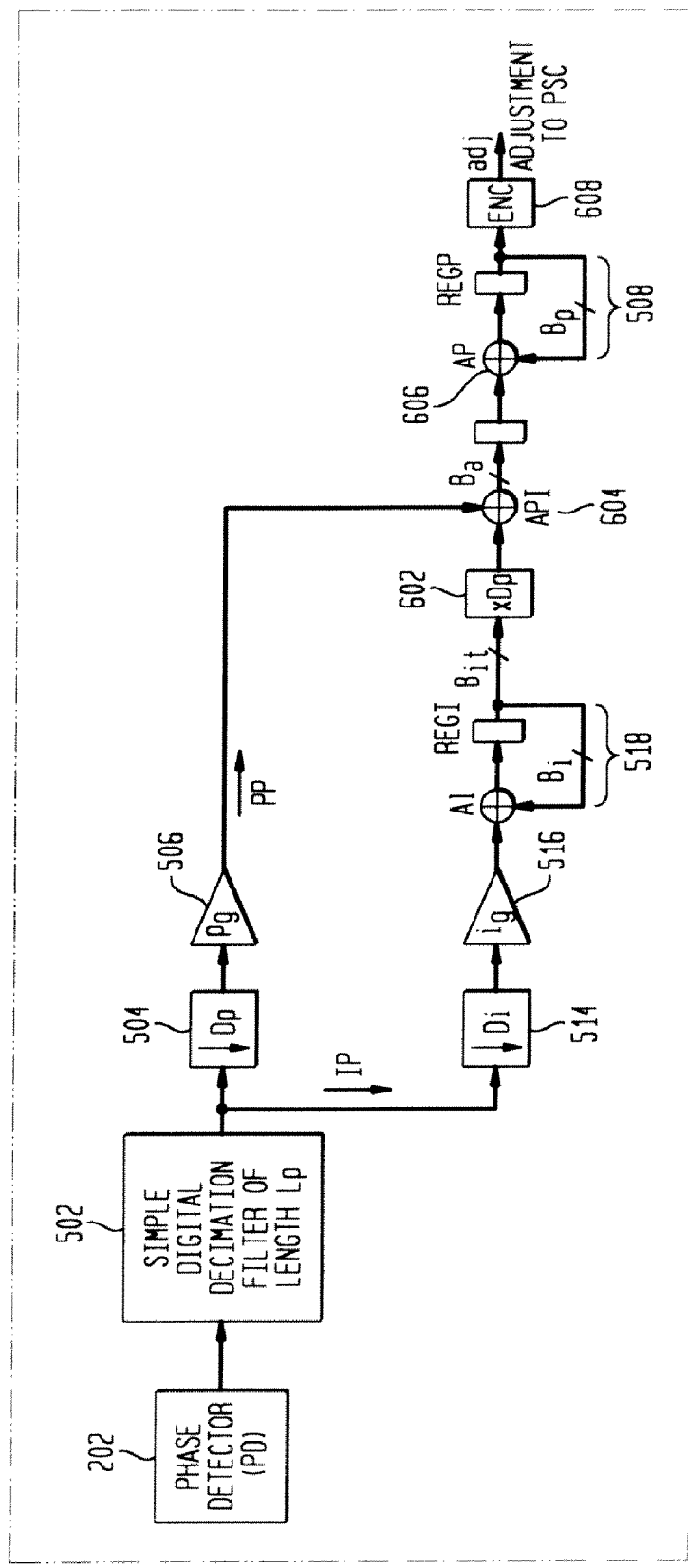
FIG. 6 is a block diagram of the digital filter of a decimated digital loop filter in which both the sub-filters are preceded by a common digital decimation filter of length Lp.

A hardware block diagram of a similar decimated digital loop filter is depicted in FIG. 6. In this embodiment both the proportional path pp and the integral path ip are processed with the same decimation filter 502 of length $L_p$. In both of the embodiments depicted in FIGS. 5 and 6, the gain factors $p_g$ and $i_g$ optimize system performance as determined through system simulations or experiments with realistic analog waveform inputs. These gains can be chosen as multiples of powers of 2 for easy implementation as a shift of data bits. In additional embodiments of the invention one or both of the gain factors $p_g$ and $i_g$ may not necessarily be greater than one. The term "factor adjusted" is here introduced to include application of such gain factors (be they greater or not greater than one). Also depending on the actual implementation of the PSC, either the output of the final integrator 508 may be fed to the PSC or this output may pass through an optional encoder 608 to produce an actual adjustment, adj, that is supplied to the PSC.

Figure 7:
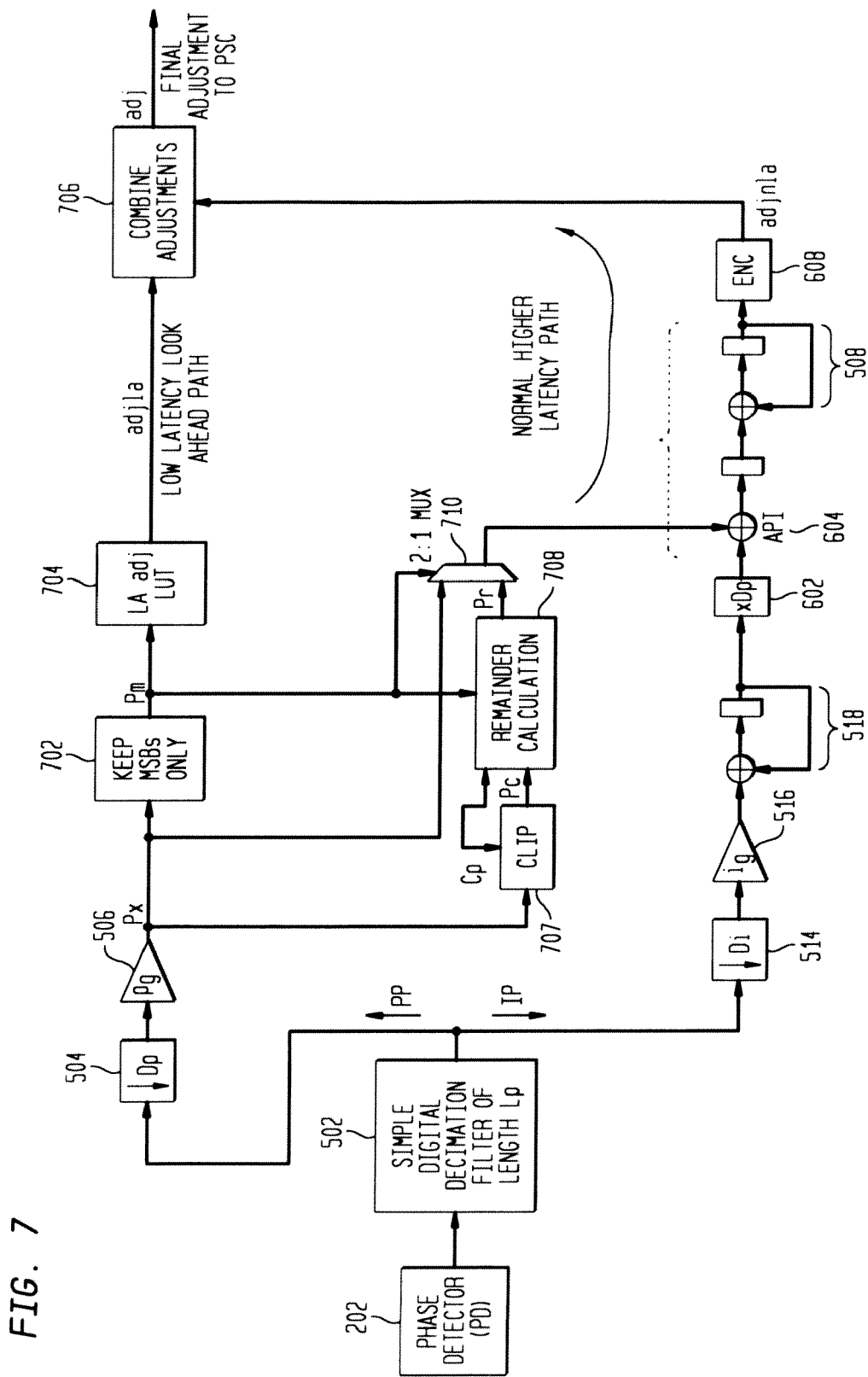
FIG. 7 is a block diagram of an embodiment of the invention having a look-ahead decimated digital loop filter.

As is well known in the art, large decimation factors correspond to large delays in the addition calculations at AP and API adder 604 of FIG. 6. In particular significant latency is incurred in this area of the depicted circuit. FIG. 7 depicts an embodiment of the invention in which the look-ahead architecture enables lower latency timing adjustments to be supplied to the PSC, bypassing this higher latency path.

FIG. 7 depicts phase detector 202 coupled to decimation filter 502. As used herein the term "coupled" is used to encompass both a direct electrical connection as well as a connection in which one or more intervening elements may be positioned. By way of example, utilizing this definition, phase detector 202 is coupled to combining element 706.

As further illustrated in FIG. 7, the proportional path pp output of the decimation filter 502 is downsampled 504 and gained 506 by a factor of $p_g$. The result of these processes yields $p_x$ which is then subjected to a thresholding process at 702 to yield $p_m$. The output of the thresholding process is used to calculate and send a timing adjustment adjla to the PSC rather than waiting for the decimation filter output to be processed by the rest of the loop filter.

In the embodiment of the invention depicted in FIG. 7, the thresholding process 702 consists of retaining several of the most significant bits (MSBs) of $p_x$ to yield $p_m$. This result can then be quickly used to determine the amount of timing adjustment which needs to be sent to the PSC. As depicted in FIG. 7, this determination is efficiently achieved by means of a small look up table (LUT) 704. If the MSBs determine that no timing adjustment is required in the look-ahead path, then the full decimation filter output is sent to the API adder 604 (as had been done in FIG. 6). However, if the look-ahead path generated an adjustment, adjla, its effect must be removed from the full decimation filter output at 708 to produce a compensated decimation filter output or "remainder term" $p_r$, which is then supplied to the API adder 604.

A 2:1 multiplexer (MUX) 710 selects between the full decimation output $p_x$ and the remainder term $p_r$ based on whether or not any adjustment was produced by the look-ahead path. The output of MUX 710 is supplied to the API adder 604 and the result processed as the normal higher latency adjustment from the non-look-ahead path. The adjustments from the look-ahead and non-look-ahead paths (adjla and adjnla, respectively) are combined (at 706) and then supplied to the PSC. Since the adjustment signals are typically very low bit width signals (1-3 bits), this combination function can be performed relatively quickly with low latency.

The embodiment depicted in FIG. 7 displays an optional feature of the invention wherein a clipping filter is employed at 707 to attain $p_c$, a clipped version of $p_x$. By way of example, this clipping operation would limit the result based upon some clipping level $c_p$, where $c_p$ is a constant value. By way of example, $c_p$ may be a power of 2 (e.g. 1024 or 512) to permit an easier circuit implementation. An example of this clipping operation is described by the following equations:

If $p_x \geq c_p-1$, $p_c = c_p-1$

Else if $p_x < -c_p$, $p_c = -c_p$ else, $p_c = p_x$.

In an additional embodiment of the invention, the look-ahead adjustment adjla is produced from a finite set of limited values. For example, the look-ahead adjustment could be zero, +/−1 or +/−2 times a unit time adjustment which is denoted by A. An exemplary algorithm to calculate the look-ahead adjustment as well as the reminder term $p_r$ is provided by the following equations where a comparison is made between $p_x$ and $c_l$ where $c_l$ is a fixed constant value (e.g., a power of 2), that is not necessarily equal to $c_p$.

If $p_x \geq c_l$, adjla=2A and $p_r = p_c - c_l$ else if $p_x \geq c_l/2$, adjla=A and $p_r = p_c - c_l/2$ else if $p_x \leq -c_l$, adjla=−2A and $p_r = p_c + c_l$ else if $p_x \leq -c_l/2$, adjla=−A and $p_r = p_c + c_l/2$ else: adjla=0 and $p_r = p_x$, where the last equation corresponds to the 2:1 MUX, 710, selecting the $p_x$ signal directly.

In a further embodiment of the invention depicted in FIG. 7, rather than using the above described equations, the invention examines $p_m$ which represents several MSBs of $p_x$. By way of example, letting the MSBs consist of 5 bits (p4, p3, p2, p1 and p0; p4 being the highest bit), then the conditions of the above equations can be almost equivalently determined using the following Boolean combinational logic expressions:

If ((!p4)X(p3+p2+p1)) adjla=2A and $p_r = p_c - c_l$ else if ((!p4)X(p3+p2+p1+p0)) adjla=A and $p_r = p_c - c_l/2$ else if ((p4)X(!p3+!p2+!p1)) adjla=−2A and $p_r = p_c + c_l$ else if ((p4)X(!p3+!p2+p1+!p0)) adjla=−A and $p_r = p_c + c_l/2$ else adjla=0 and $p_r = p_x$ These expressions are evaluated using twos complement arithmetic where "!" represents a bit inversion, "X" corresponds to a bit level "and" operation and "+" corresponds to a bit level "or" operation. Thus, by way of example, the invention would evaluate the Boolean expression (!p4)X(p3+p2+p1) and if true, would set the same values of adjla and $p_r$ as if $p_x \geq c_l$ (i.e., adjla=2A and $p_r = p_c - c_l$).

In this embodiment, because only the MSBs of $p_x$ are used, the adjustment adjla can be determined very quickly with a simple look up table 704 and accordingly very little latency penalty is incurred in this path. In alternative embodiments of the invention the LUT implementation comprises alternative simple combinational digital logic processing of the MSBs of $p_x$, as the invention is not limited to the example above utilizing Boolean expressions.

As depicted in FIG. 7, the look-ahead adjustment adjla is combined at 706 with the adjustment for the non look-ahead path adjnla to form the total adjustment adj sent to the PSC. This combination function can be performed in a variety of ways. In one embodiment the two adjustments could be added such as adj=adjla+adjnla. Alternatively, they could be multiplexed or they could be added as above and then clipped to form the final adjustment.

Figure 8:
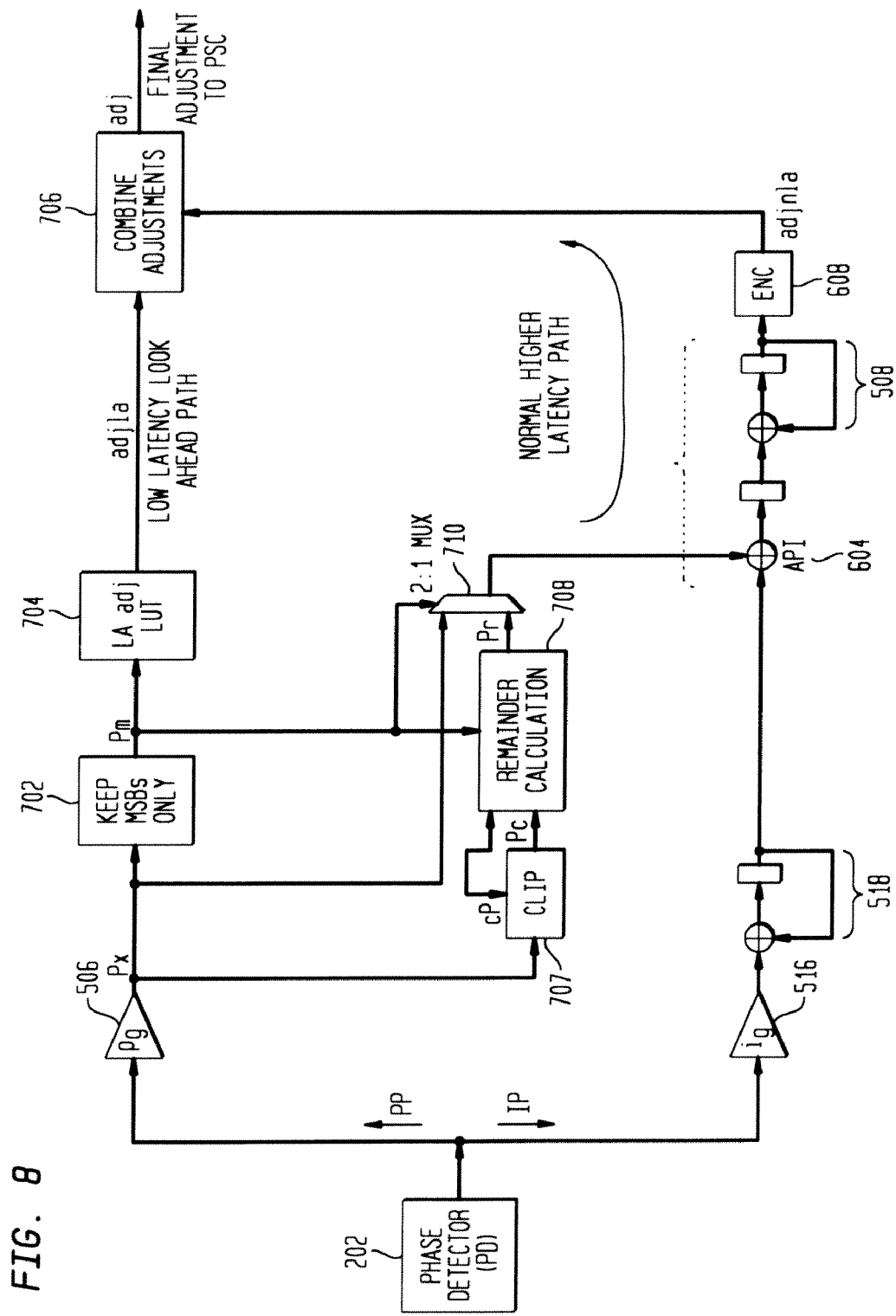
FIG. 8 is a block diagram of an embodiment of the invention having a look-ahead digital loop filter without decimation.

The invention is not limited to decimated digital loop filters. FIG. 8 illustrates an alternative embodiment of the invention which is used with a non-decimated digital loop filter. FIG. 8 is a block diagram representation of a look-ahead digital loop filter again using a second order loop filter consisting of two sub-filters, a proportional path pp sub-filter (upper path) and an integral path ip sub-filter (lower path). Accordingly, FIG. 8 is similar to FIG. 7 and performs in the same manner described above with the exception of the decimation filter 502 and downsampling components 504 and 514, which have been omitted. The embodiment of the invention illustrated in FIG. 8 also depicts the optional clipping component 707, although as noted above with respect to FIG. 7, this feature is not required in alternative embodiments. The look-ahead architecture of the present invention is particularly useful in such a filter where there is substantial latency produced in the non-decimated architecture. By way of example, it would be valuable to use with a non-decimated loop filter if the latency due to pipelining of the calculations is substantial.

In the embodiment depicted in FIG. 6 a digital decimated CDR loop filter adds/transfers information from one state of the loop filter to other parts of the loop filter using a limited bit resolution (e.g., the most significant bits of an internal state) followed by a fixed gain (at 602). A further embodiment of the invention will now be discussed in which a variable gain is employed—substituting the fixed gain with a variable gain comprised of additional bits from the state whose information is being added/transferred. This feature enhances the performance of the system by increasing the arithmetic resolution of information added/transferred without increasing the bit width required in hardware components.

In a typical embodiment depicted by the block diagram of FIG. 6, an adder AI processes the "integral" path, ip, signal and forms part of the integral path integrator 518. As depicted the full width of the integral register, REGI, is $B_i$ bits. The "top" $B_{it}$ or most significant bits of this register are gained by a fixed gain factor $D_p$ at item 602 and added into an adder API 604 along with the signal from the "proportional" pp path. The gain of $D_p$ is the same as the proportional decimation factor at 504. The adder API 604 adds the components from the integral and proportional paths. In this embodiment the width of adder API 604 consist of $B_a$ bits. As depicted in FIG. 6, the output of adder API 604 is integrated or added into the adder AP 606 which forms part of the proportional path integrator 508. As further illustrated in FIG. 6, AP 606 and the proportional register REGP have a width of $B_p$ bits.

The larger $B_{it}$ is, the larger $B_a$ and $B_p$ need to be for a given relationship between the registers. This relationship entails defining that bit position of REGP which is aligned with the top most bit of REGI (via adder API 604). The particular relationship is determined by other system level considerations as is known to one skilled in the art. The greater the number of $B_{it}$ bits also requires more complexity in these circuits. However, a larger $B_{it}$ can provide performance improvement in the loop filter due to using more bits, and therefore more precision, in transferring the integral register information to the rest of the loop filter.

Figure 9:
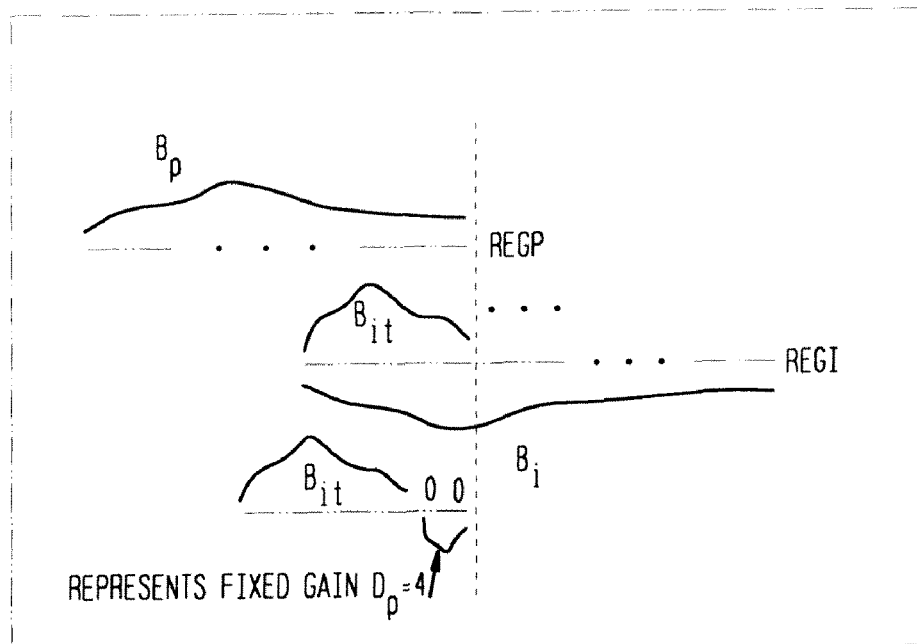
FIG. 9 illustrates register alignments associated with the embodiment of the invention depicted in FIG. 6 wherein a fixed gain factor $D_p$ is applied to the $B_{it}$ bits being transferred.

FIG. 9 shows one possible register configuration per the above description whereby REGP and REGI are aligned such that $B_{it}$=6 and the most significant bit of REGI is aligned with the $6^{th}$ least significant bits of REGP. If the decimation factor $D_p$ is 4 as depicted, $B_{it}$ must be multiplied by 4 (or left shifted by 2 positions) before being added to API 604. This is illustrated in the last row of FIG. 9. In effect $B_{it}$+2 bits are added to API 604 but the last two bits carry no useful information.

Figure 10:
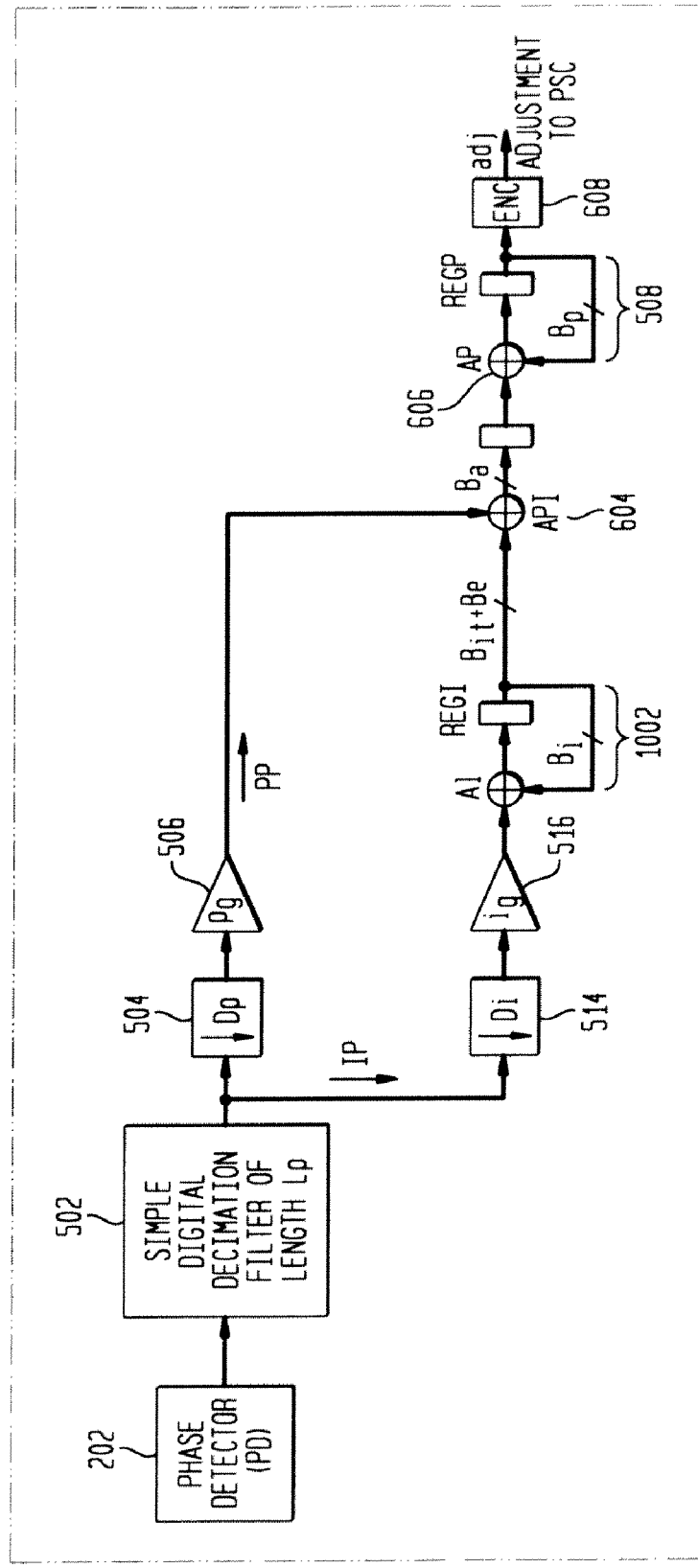
FIG. 10 is a block diagram of an embodiment of the invention wherein a variable gain replaces the fixed gain factor $D_p$; and, FIG. 11 illustrates register alignments associated with an embodiment of the invention depicted in FIG. 10 wherein a variable gain factor is applied to the $B_{it}$ bits being transferred.

FIG. 10 is a block diagram of a further embodiment of the invention in which a variable gain substitution is employed. In particular a comparison with FIG. 6 shows that item 602 (and its associated gain, $D_p$) has been removed. Rather, and as illustrated in FIG. 10, $B_e$ extra bits (for a total of $B_{it}$+$B_e$) are being transferred from the integral path, IP, to API 604 with a variable gain determined by the number and value of the extra bits which are utilized. Moreover, these extra bits $B_e$ incorporate extra resolution into the transfer of integral path information to the rest of the CDR circuit.

The use of extra bits to accomplish these goals is achieved by substituting the bits which yielded the fixed gain introduced at item 602 with the next $B_e$ significant bits from REGI (i.e., those bits of $B_i$ after the $B_{it}$ most significant bits), where $B_e = \log_2(D_p)$ and as noted above, $D_p$ is the decimation factor introduced in item 504. The total bits transferred by integrator 1002 is $B_{it}$+$B_e$ with the noted constraint that $B_e = \log_2(D_p)$. Since the extra bits, $B_e$ are substituted into the place of the fixed gain "zero" bits, no extra bits are required in AP 606 to accommodate this change. The previous fixed gain of $D_p$ is replaced by a variable gain since the actual gain value is dependent on the actual values taken on by the relevant $B_e$ bits. This variable gain substitution not only allows proper operation of the decimated loop filter but allows for enhanced arithmetic resolution in the transfer of information from the integral path to the rest of the loop filter.

Figure 11:
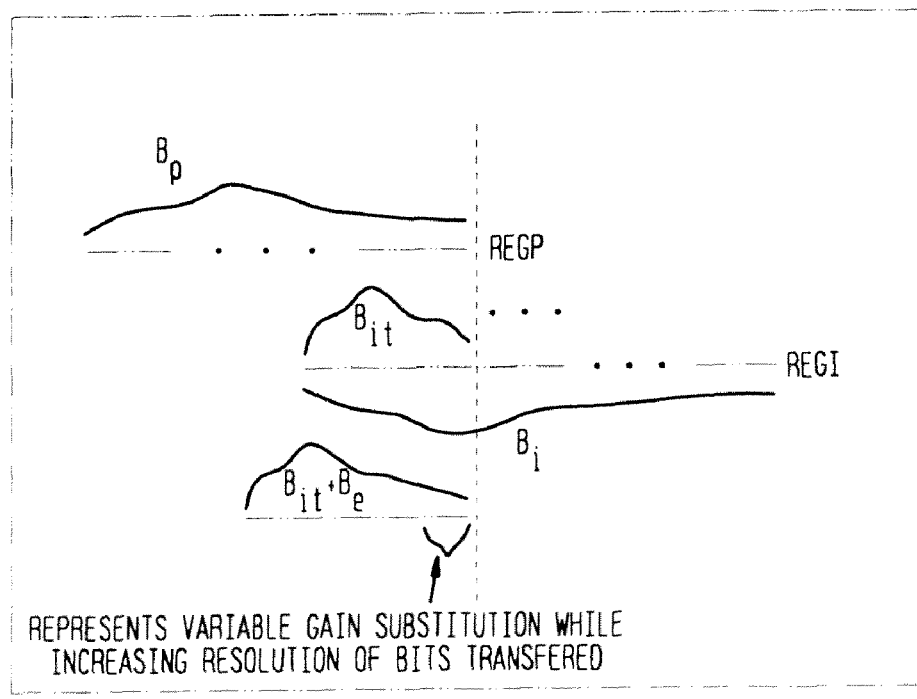

FIG. 11 illustrates a comparison of this embodiment of the invention with the register alignments of FIG. 9. As noted in the above discussion of FIG. 9, $D_p$ represents a fixed gain of 4, requiring a shifting of $B_{it}$ to the left 2 bit positions. The last row of FIG. 11 depicts how two bits of $B_e$ (rather than the two "0" bits of FIG. 9) are employed to effect a gain essentially of the same magnitude, but with more precision.

This principle of variable gain substitution can be used with a digital decimated CDR employing look ahead techniques, such as the embodiment depicted in FIG. 7. As described above with respect to FIG. 6, the fixed gain factor $D_p$ introduced at item 602 would be essentially replaced with the variable gain of the added $B_e$ bits.

In further embodiments, the variable gain substitution feature can be used with decimated digital loop filters employing higher order loop filters than those illustrated in FIGS. 6 and 7. Actual implementations of this feature are dependent upon the order of the filter and in which path(s) of the filter the substitution is performed. Such implementations can readily be performed by one skilled in the art.

Additional Embodiments of the Invention

The above described embodiments of the invention are meant to illustrate the invention. The invention is not necessarily limited to the specific features described above. In particular, further embodiments of the invention include the following features:

The look-ahead selection may be performed in a number of different ways. The above described embodiment where there are +/−1 and +/−2 units of timing adjustment is only one example.

The look-ahead path may be driven by some intermediate point in a decimation filter path rather than by the final decimation filter output. Thus in multi-stage decimation filters, the look-ahead could be driven by one of the earlier stages thereby reducing the latency in the look-ahead path even further.

The look-ahead logic can be used in conjunction with a decimated digital loop filter which is not necessarily a second order filter. For example, it could be used with even a first order filter (thereby still potentially bypassing the latency of the integrator 508) or other higher order filters.

The look-ahead logic can be used in situations where a decimated digital loop filter is driven by multiple phase detectors the outputs of which are combined and processed by a single decimation filter.

In various embodiments of the invention in which a gear shifting gain scheduling profile is used for the proportional gain in the decimated filter, the look-ahead logic can be shut down for lower values of the gear shift value as it will not be invoked.

While the invention has been described with reference to various embodiments thereof, it will be appreciated by those of ordinary skill in the art that modifications can be made to the structure and elements of the invention without departing from the spirit and scope of the invention as a whole.

What is claimed is:

1. A clock and data recovery circuit (CDR) for recovery of an inputted analog signal, said circuit comprising:
   a data detector adapted to receive said inputted analog signal;
   a phase detector coupled to said data detector;
   a digital loop filter, coupled to said phase detector, comprising a low latency look-ahead path and a non-look-ahead path;
   a phase selection circuit (PSC), coupled to said digital loop filter, producing a recovered sampling clock signal that is inputted to the data detector;
   a threshold processor that is positioned at a location in the CDR circuit that is intermediate said phase detector and said PSC, said threshold processor receiving a threshold processor input signal and producing a threshold processor output; and
   an adjustment calculating means for converting said threshold processor output into a look-ahead timing adjustment that is supplied to the PSC over said low latency look-ahead path, wherein said look-ahead timing adjustment from said low latency look-ahead path is applied to said PSC prior to a non-look ahead timing adjustment from said non-look-ahead path for a given inputted analog signal, wherein said digital loop filter further comprises a higher latency path and wherein said circuit further comprises:
   remainder calculating means for calculating a remainder term based on inputted data comprising the threshold processor input signal and the threshold processor output;
   a multiplexer for selecting between the threshold processor input signal and the remainder term to yield a multiplexer output, which multiplexer output is processed by said higher latency path to yield said non-look-ahead timing adjustment; and,
   a circuit for combining said look-ahead timing adjustment and said non-look-ahead timing adjustment to provide a final timing adjustment that is supplied to the PSC.

2. The CDR circuit of claim 1 wherein said threshold processor comprises means for comparing the threshold processor input signal with multiples of a fixed parameter.

3. The CDR circuit of claim 1 wherein said adjustment calculating means comprises a look up table.

4. The CDR circuit of claim 1 wherein said threshold processor output comprises one or more of the most significant bits (MSBs) of the threshold processor input signal.

5. The CDR circuit of claim 4 wherein said adjustment calculating means comprises one or more Boolean combinational logic operations performed on at least some of said MSBs.

6. The CDR circuit of claim 1 further comprising:
   clipping means, coupled to said remainder calculator means, deriving a clipped version of the threshold processor input signal.

7. The CDR circuit of claim 1 wherein said higher latency path comprises an integrator.

8. The CDR circuit of claim 1 wherein the phase detector produces a phase detector output, the digital loop filter is a decimated digital loop filter and wherein said threshold processor input signal is the phase detector output that has been decimated, downsampled and factor adjusted.

9. The CDR circuit of claim 1 wherein the digital loop filter is a non-decimated digital loop filter and wherein said threshold processor input signal is the phase detector output that has been factor adjusted.

10. A method for recovering an inputted analog signal supplied to a Clock and data recovery (CDR) circuit, said circuit comprising a digital loop filter and a phase selection circuit (PSC); said method comprising:
   dividing the digital loop filter into at least two segments, one of which is a low latency look-ahead path and a second of which is a non-look-ahead path;
   providing a threshold processor for receiving a threshold processor input signal and producing a threshold processor output; and converting said threshold processor output into a look-ahead timing adjustment that is supplied to the PSC over said low latency look-ahead path, wherein said look-ahead timing adjustment from said low latency look-ahead path is applied to said PSC prior to a non-look ahead timing adjustment from said non-look-ahead path for a given inputted analog signal, wherein said digital loop filter further comprises a higher latency path; said method further comprising:

calculating a remainder teim based on inputted data comprising the threshold processor input signal and the threshold processor output;

selecting between the threshold processor input signal and the remainder term to yield a selection result; processing said selection result by said higher latency path to yield said non-look-ahead timing adjustment; and, combining said look-ahead timing adjustment and said non-look-ahead timing adjustment to provide a final timing adjustment that is supplied to the PSC.

11. The method of claim 10 wherein said producing a threshold output comprises comparing the threshold processor input signal with multiples of a fixed parameter.

12. The method of claim 10 wherein said converting step comprises utilizing a look up table.

13. The method of claim 10 wherein said producing a threshold processor output comprises utilizing one or more of the most significant bits (MSBs) of the input signal.

14. The method of claim 13 wherein said converting step comprises utilizing one or more Boolean combinational logic operations performed on at least some of said MSBs.

15. The method of claim 10 further comprising:
deriving a clipped version of the threshold processor input signal, said deriving step comprising comparing the threshold processor input signal with a fixed constant.

16. An integrated circuit comprising a Clock and data recovery (CDR) circuit for recovery of an inputted analog signal, said CDR circuit comprising:
a data detector adapted to receive said inputted analog signal;
a phase detector coupled to said data detector;
a digital loop filter, coupled to said phase detector, comprising a low latency look-end of line hyphenahead path and a non-look-ahead path;
a phase selection circuit PSC, coupled to said digital loop filter, producing a recovered sampling clock signal that is inputted to the data detector;
a threshold processor that is positioned at a location in the CDR circuit that is intermediate said phase detector and said PSC, said threshold processor receiving a threshold processor input signal and producing a threshold processor output; and
an adjustment calculating means for converting said threshold processor output into a look-ahead timing adjustment that is supplied to the PSC over said low latency look-ahead path, wherein said look-ahead timing adjustment is applied to said PSC prior to a non-look ahead timing adjustment from said non-look-ahead path for a given inputted analog signal, wherein said digital loop filter further comprises a higher latency path and wherein said circuit further comprises:
remainder calculating means for calculating a remainder term based on inputted data comprising the threshold processor input signal and the threshold processor output;
a multiplexer for selecting between the threshold processor input signal and the remainder term to yield a multiplexer output, which multiplexer output is processed by said higher latency path to yield said non-look-ahead timing adjustment; and
a circuit for combining said look-ahead timing adjustment and said non-look-ahead timing adjustment to provide a final timing adjustment that is supplied to the PSC.

17. The integrated circuit of claim 16 further comprising:
clipping means, coupled to said remainder calculator means, deriving a clipped version of the threshold processor input signal.

18. A clock and data recovery circuit (CDR) for recovery of an inputted analog signal, said circuit comprising:
a data detector adapted to receive said inputted analog signal;
a phase detector coupled to said data detector;
a digital loop filter, coupled to said phase detector;
a phase selection circuit (PSC), coupled to said digital loop filter, producing a recovered sampling clock signal that is inputted to the data detector;
a threshold processor that is positioned at a location in the CDR circuit that is intermediate said phase detector and said PSC, said threshold processor receiving a threshold processor input signal and producing a threshold processor output; and
an adjustment calculating means for converting said threshold processor output into a look-ahead timing adjustment that is supplied to the PSC over a low latency look-ahead path, wherein said look-ahead timing adjustment is applied to said PSC prior to an adjustment from a non-look-ahead path for a given inputted analog signal, wherein a value generated by a component within said low latency look-ahead path within said digital loop filter contributes to said non-look-ahead path.

* * * * *

UNITED STATES PATENT AND TRADEMARK OFFICE
CERTIFICATE OF CORRECTION

PATENT NO. : 8,194,792 B2  
APPLICATION NO. : 11/029977  
DATED : June 5, 2012  
INVENTOR(S) : Pervez M. Aziz and Necip Sayiner Page 1 of 1

It is certified that error appears in the above-identified patent and that said Letters Patent is hereby corrected as shown below:

In the Claims

Column 9, claim 10, line 10 which reads: "remainder teim based" should read --remainder time based--; claim 16, line 35, which reads: "a Clock and data" should read --a clock and data--; claim 16, line 42, which reads: "latency look-end of the line hyphenahead path" should read --latency look-ahead path--.

Signed and Sealed this  
Twenty-second Day of October, 2013

Teresa Stanek Rea  
*Deputy Director of the United States Patent and Trademark Office*